United States Patent [19]
Lin

[11] Patent Number: 5,935,282
[45] Date of Patent: Aug. 10, 1999

[54] CABINET PANEL HAVING A REMOVABLE FILTER ELEMENT

[75] Inventor: Chun-Sung Lin, Taipai, Taiwan

[73] Assignee: Macase Industrial Group G.A., Inc., Norcross, Ga.

[21] Appl. No.: 08/970,126

[22] Filed: Nov. 13, 1997

[51] Int. Cl.[6] .................................................. B01D 46/10
[52] U.S. Cl. ............................ 55/385.6; 55/495; 55/501; 55/511; 55/DIG. 31
[58] Field of Search .................................. 55/385.6, 495, 55/501, 511, DIG. 31; 261/DIG. 65

[56] References Cited

U.S. PATENT DOCUMENTS

| | | | |
|---|---|---|---|
| 2,869,694 | 1/1959 | Breckheimer | 55/DIG. 31 |
| 2,976,796 | 3/1961 | Anthony et al. . | |
| 3,058,279 | 10/1962 | Metcalfe | 55/DIG. 31 |
| 3,950,157 | 4/1976 | Matney | 55/DIG. 31 |
| 4,126,269 | 11/1978 | Bruges . | |
| 4,334,899 | 6/1982 | McConnell | 55/DIG. 31 |
| 4,743,281 | 5/1988 | Kennedy et al. | 55/DIG. 31 |
| 4,751,872 | 6/1988 | Lawson, Jr. . | |
| 4,889,542 | 12/1989 | Hayes . | |
| 5,236,478 | 8/1993 | Lewis et al. . | |
| 5,462,569 | 10/1995 | Benjamin | 55/385.6 |
| 5,514,036 | 5/1996 | Lin . | |
| 5,527,493 | 6/1996 | McElfresh et al. | 261/DIG. 65 |

FOREIGN PATENT DOCUMENTS

| | | | |
|---|---|---|---|
| 294597 | 10/1992 | Japan . | |
| 405261227 | 10/1993 | Japan | 55/DIG. 31 |
| 406047228 | 2/1994 | Japan | 55/DIG. 31 |

Primary Examiner—Jay H. Woo
Assistant Examiner—Minh-Chau T. Pham
Attorney, Agent, or Firm—Hinkle & Associates, P.C.

[57] ABSTRACT

A cabinet panel (10) has a filter element (12) for removing particles from cooling air used in an electronics enclosure. The filter element is removably mounted to the cabinet panel adjacent an air intake opening (14). Plugs (18) extend outwardly from the cabinet panel at predetermined locations proximate the air intake opening to releasably and matingly engage bores (30) disposed about a frame (22) of the filter element to form an air sealing relationship with the cabinet panel so that air passing through the air intake opening passes through the filter element. A cover (32) having an aperture (34) is removably mounted to the panel so that air passing through the filter element passes through the aperture. In one embodiment, the cover is removably, pivotally mounted to the panel. In another embodiment, the cover has locking arms (60) that removably engage locking slots (44) which are matingly disposed through the cabinet panel.

3 Claims, 2 Drawing Sheets

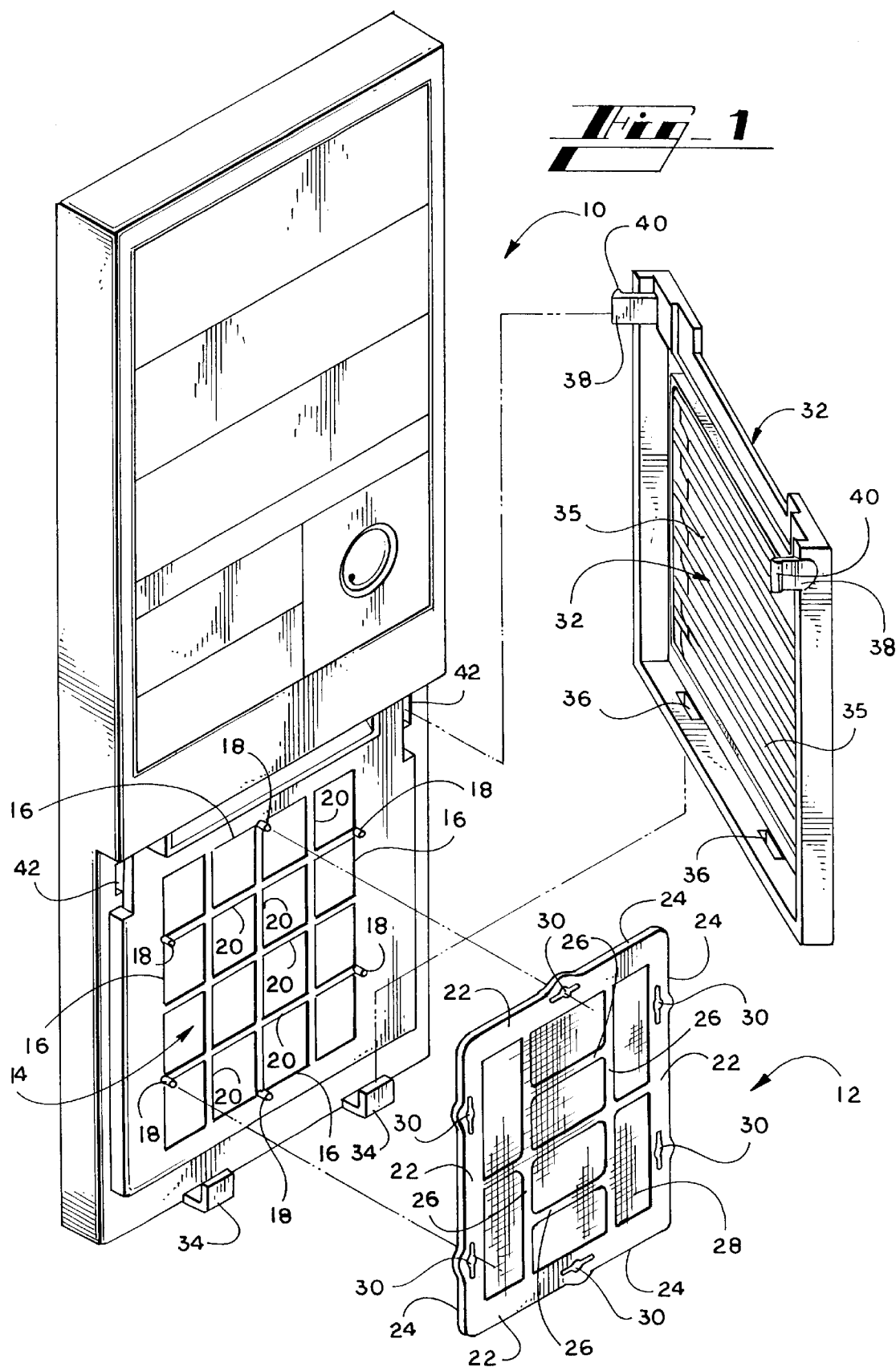

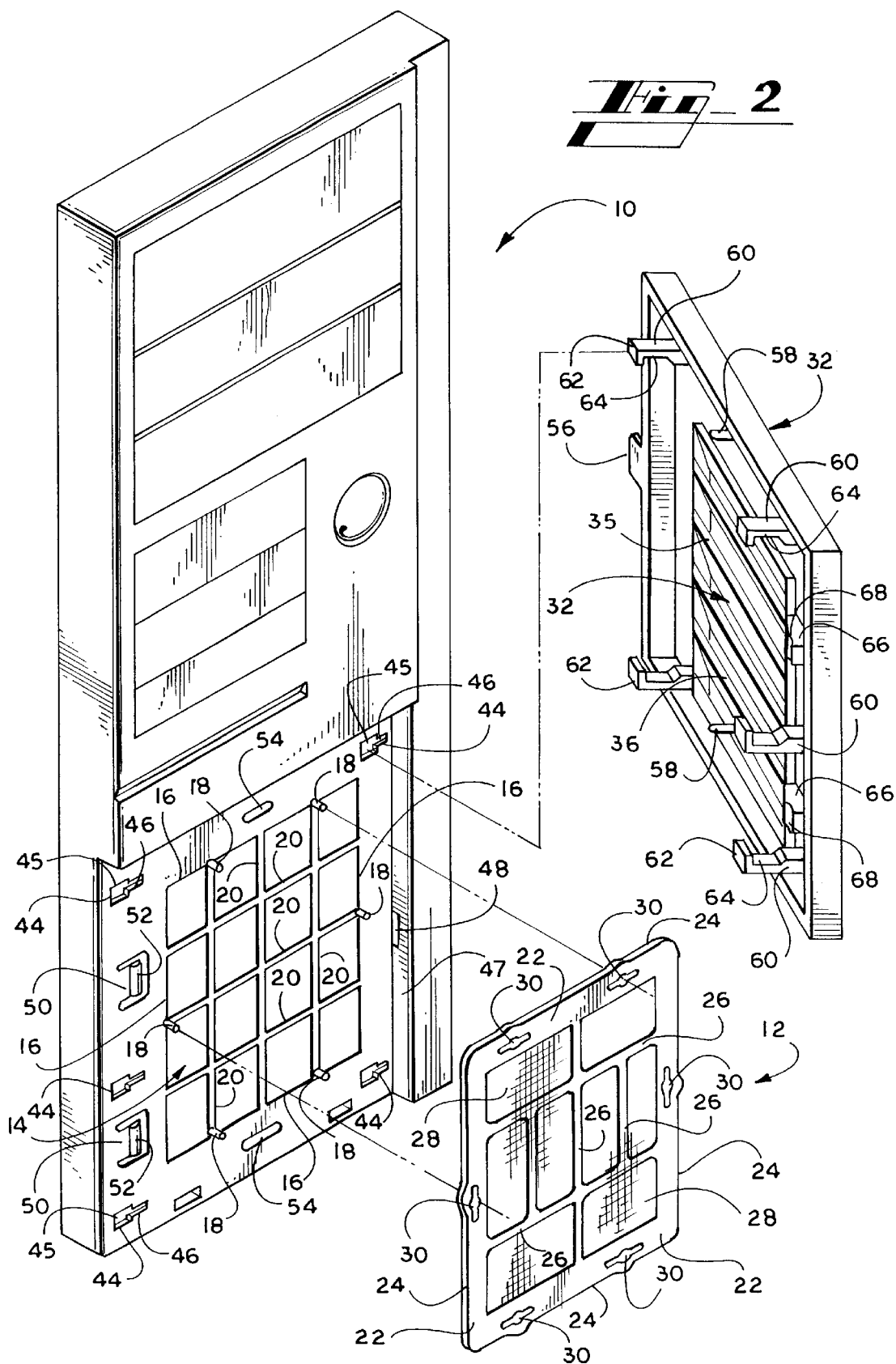
Fig_2

CABINET PANEL HAVING A REMOVABLE FILTER ELEMENT

BACKGROUND OF THE INVENTION

I. Field of the Invention

The present invention relates generally to the field of filtered ventilation systems of an electronics enclosure. More particularly, the present invention relates to a panel having a removable filter element with an adjacent cover for the ventilation system of an electronics enclosure.

II. Description of the Related Art

Electronic devices, particularly computers, are commonly housed within an enclosure, such as a case or a cabinet. The electronic components contained therein often produce heat which must be removed so the electronic components can function properly. Often, ventilation devices are employed that use rotating fans to circulate air around the heat producing electronic components to carry away the heat.

There are many small dust particles and impurities in the air, some of which contain highly conductive materials. The build-up of a large quantity of accumulated conductive materials can lead to a breakdown of the computer or disk drive due to short-circuits. The accumulation of dust and impurities can also damage a reading head or diskette in a disk drive by dust-induced friction, and it can lead to an abnormal readout, inability to read, or even damage to the disk drive. Dust and impurities in the air have a great impact on computers and disk drives.

The commonly known ventilation methods use a fan to bring air inside the computer or disk drive. Usually, such a fan draws air into the case from all openings, exhausting the air at the location of the fan. This method quickens the rate at which dust and impurities in the air accumulate inside a computer or disk drive. The harmful effects may not be obvious when a computer is used only for a short period of time. However, after it has been used for some time, a layer of dust and impurities will accumulate on the disk drive or computer.

To resolve this problem, I described a disk drive within a cabinet, with a filter element structure in U.S. Pat. No. 5,514,036. This device has a front panel that is removable from a sub-panel of a cabinet. The sub-panel has two spacing blocks, one on each side of an air hole. A fan is adjacent the air hole on the opposite side of the sub-panel from the spacing blocks. The front edges of the spacing blocks are set such that they form a seal with an outer periphery of a filter unit. The front panel has two guides provided to receive the filter unit. Attached to the filter unit are two flexible fingers ending in retaining surfaces. When the filter unit is fully inserted into the guides, the filter unit is held in place by the retaining surfaces which extend under the bottom of the guides.

SUMMARY OF THE INVENTION

In accordance with the present invention and the contemplated problems which have and continue to exist in this field, one of the objectives of this invention is to provide a new and unique cabinet panel having a removable filter element.

It is another object of the present invention to remove dust and other particulates from circulation air prior to the air entering an air intake opening of an electronics enclosure.

Still, it is an object of the present invention to provide a cabinet panel having an air intake opening, a removable filter element disposed adjacent the air intake opening, and a cover removably mounted to the cabinet panel adjacent the filter element.

Yet, it is an object of the present invention to provide a filter element having bores predetermatively disposed about a frame that removably engage plugs which are matingly disposed about an air intake opening.

This invention accomplishes the above and other objectives and overcomes the disadvantages of the prior art by providing a cabinet panel having a removable filter element that is simple in design and construction, inexpensive to fabricate, and easy to use. The embodiments of this invention provide a filter element for removing particles from cooling air used in an electronics enclosure. The filter element is removably mounted adjacent an air intake opening to filter out dust and other impurities prior to the air entering the electronics enclosure or cabinet. The cabinet panel has plugs extending outwardly therefrom at predetermined locations about the air intake opening. The filter element has bores matingly disposed about a frame to releasably engage the plugs in an air sealing relationship with the panel so that air passing through the air intake opening passes through the filter element. A cover having a louver-type aperture is removably mounted to the panel so that air passing through the filter element passes through the aperture. In one embodiment, the cover is removably, pivotally mounted to the panel. In another embodiment, the cover has locking arms that removably engage locking slots matingly disposed through the panel to removably mount the cover to the panel.

It is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

Other objects, advantages and capabilities of the invention will become apparent from the following description taken in conjunction with the accompanying drawings showing preferred embodiments of the invention.

BRIEF DESCRIPTION OF THE DRAWINGS

The invention will be better understood and the above objects as well as objects other than those set forth above will become apparent when consideration is given to the following detailed description thereof. Such description makes reference to the annexed drawings wherein:

FIG. 1 is an exploded, perspective view of an embodiment of a cabinet panel having a removable filter element made in accordance with the present invention; and FIG. 2 is exploded, perspective view of another embodiment of the cabinet panel having a removable filter element made in accordance with the present invention.

The reference numbers in the drawings relate to the following:

10 =cabinet panel
12 =filter element
14 =air intake opening
16 =periphery of air intake opening
18 =plug
20 =intake opening support member
22 =frame of filter element
24 =frame outer edge
26 =frame support member
28 =filter 30 =bore
32 =cover
34 =pivot arm
35 =louver pivot slots
36 =louver
38 =latch arm
40 =retaining surface of latch arm
42 =latch opening
44 =lock slot
45 =wide portion of lock slot
46 =narrow portion of lock slot
47 =wall
48 =guide slot
50 =tab
52 =protrusion
54 =alignment slot
56 =guide
58 =rod
60 =lock arm
62 =head of lock arm
64 =neck of lock arm
66 =post
68 =end surface of post

DETAILED DESCRIPTION OF THE PREFERRED EMBODIMENTS

For a fuller understanding of the nature and desired objects of this invention, reference should be made to the following detailed description taken in connection with the accompanying drawings. Referring to the drawings wherein like reference numerals designate corresponding parts throughout the several figures, reference is made first to FIG. 1. FIG. 1 of the drawings illustrates an embodiment of a cabinet panel 10 having a removable filter element 12 made in accordance with the present invention. The cabinet panel 10 may be fastened to a cabinet (not shown) by using any conventional securing method, such as screws, gripping surfaces, snap-in fasteners, etc.

With reference to FIG. 1 and additional reference to FIG. 2, a circulation air intake opening 14 having a periphery 16 is provided on the cabinet panel 10 which is used as an air intake. Although shown having a square shape, the air intake opening 14 can have any desired shape. Plugs 18 extend outwardly from the cabinet panel 10 around the air intake opening 14 adjacent the periphery 16 at predetermined locations. Intake opening support members 20 optionally extend across the air intake opening 14 from one portion of the periphery 16 to another portion of the periphery 16.

The filter element 12, as shown in FIGS. 1 and 2, is removably disposed adjacent the air intake opening 14 in an air sealing relationship with the cabinet panel 10. Accordingly, the filter element 12 preferably has the same shape as the air intake opening 14. For support, the filter element 12 has a frame 22, and the frame 22 has a frame outer edge 24. The frame 22 has a sufficient size so when the filter element 12 is placed adjacent the air intake opening 14, the frame 22 engages the cabinet panel 10 and the frame outer edge 24 surrounds the periphery 16, thereby creating an air sealing relationship with the cabinet panel 10. To provide additional support to the frame 22, frame support members 26 extend from one portion of the frame 22 to another portion of the frame 22. Mounted to the frame 22 is a filter 28 for filtering air as the air passes through the filter element 12 and the air intake opening 14. The filter 28 can be made out of a netted weave, fiber cotton, sponge, or any filtering material that will remove dust particles while allowing sufficient air flow velocity through the air intake opening 14 as desired.

With continuing reference to FIGS. 1 and 2, the frame 22 has elongated bores 30 disposed therethrough at predetermined locations to matingly and releasably engage the plugs 18. Preferably, the frame 22 is manufactured from a flexible plastic, thereby enabling the bores 30 to expand, receive and frictionally engage the plugs 18 and maintain the frame 22 in the air sealing relationship with the cabinet panel 10.

Generally referring to FIGS. 1 and 2, a cover 32 is removably disposed adjacent the filter element 12 to protect the filter element 12 from damage. The cover 32 has an aperture 36, preferably having louvers 35, to enable air passing through the filter element 12 to pass through the cover 32.

In the embodiment illustrated in FIG. 1, the cover 32 is removably and pivotally mounted to the cabinet panel 10. Extending outwardly from the cabinet panel 10 are a pair of spaced apart L-shaped pivot arms 34. The cover 32 has a pair of spaced apart pivot slots 36 for removably and pivotally engaging the pivot arms 34. The pivot slots 36 are mating spaced apart to receive the respective pivot arms 34. Spaced apart, resilient latch arms 38 having retaining surfaces 40 extend from the cover 32. Matingly spaced apart latch openings 42 are disposed on the cabinet panel 10 proximate the air intake opening 14 to removably receive the latch arms 38, respectively. In operation, the cover 32 is placed onto the cabinet panel 10 by inserting the pivot arms 34 into the pivot slots 36, respectively. The cover 32 is then pivoted so that the latch arms 38 are inserted into the latch openings 42 and the retaining surfaces 40 removably engage the cabinet panel 10, thereby removably securing the cover 32 to the cabinet panel 10. The cover 32 can be removed from the cabinet panel 10 by pressing the latch arms 38 toward each other to disengage the retaining surfaces, retracting the latch arms 38 from the latch openings 42 by pivoting the cover 32 outwardly, and removing the cover 32 from the pivot arms 34.

Another embodiment made in accordance with the present invention is illustrated in FIG. 2. The common features of the embodiments are referenced and described above as indicated. In this embodiment, the cabinet panel 10 has a plurality of T-shaped lock slots 44 having a wide portion 45 and a narrow portion 46 around the air intake opening 14 at predetermined locations. Proximate the air intake opening 14, the cabinet panel 10 has an outwardly extending wall 47. Through the wall 47 is a guide slot 48. Proximate the opposite side of the air intake opening 14 from the guide slot 48 are a pair of spaced apart resilient tabs 50 having semi-cylindrically shaped protrusions 52. Also, proximate the air intake opening 14 are spaced apart, elongated alignment slots 54.

With continuing reference to FIG. 2, the cover 32 has a guide 56 for removably engaging the guide slot 48. A pair of spaced apart rods 58 extend outwardly from the cover 32 and are positioned to matingly and slidably engage the alignment slots 54, respectively. Preferably, for each lock slot 44 a respective matingly disposed lock arm 60 extends outwardly from the cover 32. Each lock arm 60 has a head 62 having a width that is sufficient to permit its passage into the wide portion 45 of the lock slot 44. The head 62 is connected to the lock arm 60 by a neck 64 having a width sufficient to permit its passage into the narrow portion 46 of the lock slot 44, thereby releasably engaging the respective lock slot 44 and removably securing the cover 32 to the cabinet panel 10. To hold the cover 32 in place on the cabinet panel 10, the cover 32 has a pair of spaced apart posts 66 having end surface 68, preferably arched, to respectively and matingly engage the protrusions 52 of the tabs 50. The post 66 has a sufficient length to cause the tab 50 to flex outwardly therefrom as the protrusion 52 engages the post 66. Once the protrusion 52 engages the end surface 68, the tab 50 maintains the protrusion 52 in contact with the end surface 68. In operation, the guide 56 is aligned with the guide slot 48, and the rods and lock arms 58 and 60 are inserted into the alignment slots and lock slots 54 and 44, respectively. The cover 32 is then pushed so that the neck 64 slides into the narrow portion 46 of the lock slot 44 and the protrusion 52 of the tab 50 engages the end surface 68 of the respective post 66. To release the cover 32 from the cabinet panel 10, the cover 32 is pushed in a direction so that the necks 64 of the lock arms 60 move into the wide portions 46 of the lock slots 44, thereby causing the protrusions 53 of the tabs 50 to disengage from the end surfaces 68 of the posts 66 and releasing the cover 32.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, various modifications may be made of the invention without departing from the scope thereof and it is desired, therefore, that only such limitations shall be placed thereon as are imposed by the prior art and which are set forth in the appended claims.

What is claimed is:

1. A cabinet panel comprising:

the panel having a front surface, the front surface having a cover receiving area, the panel defining a circulation air intake opening in conjunction with the cover receiving area;

a filter frame in an air sealing relationship with the air intake opening of the panel, the filter frame removably disposed adjacent the air intake opening so that air passing through the air intake opening passes through the filter frame;

a filter element for filtering air passing through the filter frame mounted in juxtaposition with the filter frame;

the filter frame having a plurality of keyhole shaped apertures therein, the panel having a plurality of projecting plugs extending outwardly therefrom for engaging the apertures of the filter frame and maintaining the filter frame in a removably mounted position with the panel;

a cover removably disposed adjacent the filter frame so that air passing through the filter element passes through the cover, the cover having a configuration to substantially overlay the cover receiving area of the panel, the cover having louvers therein allowing air to pass therethrough to the filter element, the cover having a front surface, a rear surface and a peripheral rim projecting perpendicularly from the front surface;

the cover receiving area having a plurality of latch openings therein, the cover having a plurality of latch arms for removably inserting the latch arms into the latch openings of the panel to removably engage the cover to the panel; and the latch arms projecting from the rear surface of the cover for engagement with the latch openings, the latch arms having a planar configuration and terminating in a reentrant tip.

2. A cabinet panel as claimed in claim 1 further comprising:

the cover receiving area having a plurality of pivot arms of L-shaped configuration projecting substantially perpendicular to the cover receiving area; and the cover having a plurality of pivot slots for matingly receiving the pivot arms of the cover receiving area.

3. A cabinet panel as claimed in claim 1 further comprising:

the latch openings in the cover receiving area having a first portion defining a rectangular configuration of a first size, a second portion projecting from the first portion defining a rectangular configuration of a second size smaller than the first size; and the latch arms having an L-shaped configuration projecting substantially perpendicular to the cover receiving area wherein the latch arms have a projecting leg and a shorter base leg, which base leg mates into the first portion of the latch opening.

* * * * *